(12) United States Patent
Orito et al.

(10) Patent No.: US 7,221,074 B2
(45) Date of Patent: May 22, 2007

(54) SURFACE ACOUSTIC DEVICE

(75) Inventors: Satoshi Orito, Yokohama (JP); Toru Takezaki, Yokohama (JP); Satoshi Ichikawa, Otawara (JP); Hirotada Wachi, Yokohama (JP); Tsuyoshi Oura, Kawasaki (JP); Toshifumi Tanaka, Otawara (JP); Koichi Wada, Yokohama (JP)

(73) Assignee: Fujitsu Media Devices Limited, Yokohama (JP)

( * ) Notice: Subject to any disclaimer, the term of this patent is extended or adjusted under 35 U.S.C. 154(b) by 269 days.

(21) Appl. No.: 10/989,549

(22) Filed: Nov. 17, 2004

(65) Prior Publication Data

US 2005/0121998 A1 Jun. 9, 2005

(30) Foreign Application Priority Data

Nov. 18, 2003 (JP) ............................. 2003-388576

(51) Int. Cl.
*H01L 41/08* (2006.01)
(52) U.S. Cl. .............................. 310/313 C; 310/313 B; 310/313 D
(58) Field of Classification Search ............ 310/313 R, 310/313 B, 313 C, 313 D
See application file for complete search history.

(56) References Cited

U.S. PATENT DOCUMENTS

| 4,583,047 | A | * | 4/1986 | Le Goff epouse Henaff et al. ........................ 329/304 |
| 4,748,364 | A | * | 5/1988 | Mitsutsuka ............. 310/313 D |
| 4,764,701 | A | * | 8/1988 | Garbacz et al. ......... 310/313 R |
| 5,136,266 | A | * | 8/1992 | Niitsuma .................... 333/154 |
| 5,313,178 | A | * | 5/1994 | Yamamoto .................. 333/193 |

FOREIGN PATENT DOCUMENTS

JP          10-41778          2/1998

* cited by examiner

*Primary Examiner*—Mark Budd
(74) *Attorney, Agent, or Firm*—Arent Fox LLP (57) ABSTRACT

A surface acoustic wave device includes a piezoelectric substrate, a first and a second interdigital transducers (IDTs) provided on the piezoelectric substrate. The first IDT includes multiple tracks having different frequency characteristics that are connected in parallel. The second IDT includes a normalized electrode pattern. The frequency characteristic of the multiple tracks is asymmetric to a center frequency of the SAW filter, substantially flat in a passband when those of the multiple tracks are overlapped, or complementary in the passband. Thus, it is possible to provide the surface acoustic wave device having a high damping property.

8 Claims, 14 Drawing Sheets

ELECTRODE FINGER CROSSING WIDTH ($\lambda$)

SURFACE ACOUSTIC DEVICE

BACKGROUND OF THE INVENTION

1. Field of the Invention

This invention generally relates to a surface acoustic wave device that employs a piezoelectric material, and more particularly, to a surface acoustic wave device having multiple interdigital transducers (hereinafter simply referred to as IDT) on a piezoelectric material substrate (hereinafter simply referred to as piezoelectric substrate).

2. Description of the Related Art

In these years, the above-mentioned type of filter, which is composed of surface acoustic wave (hereinafter referred to as SAW) device having multiple IDTs on the piezoelectric substrate, has been employed for a bandpass filter in a television set having a frequency range of 30 MHz to 400 MHz and an RF filter in a mobile telephone having a frequency range of 800 MHz to several GHz. An IDT includes a pair of comb-like electrodes. Each comb-like electrode is composed of a bus bar and electrode fingers having first edges connected to the bus bar and second edges that are open. A pair of comb-like electrodes is arranged so that the electrode fingers of the comb-like electrodes are alternately crossed or interleaved at regular intervals. In other words, the interleaved electrode fingers are alternately connected to two bus bars. A SAW is generated by applying an alternating voltage across the pair of comb-like electrodes. The SAW has a frequency response by which a filter having a desired frequency characteristic is obtainable.

Figure 1A:
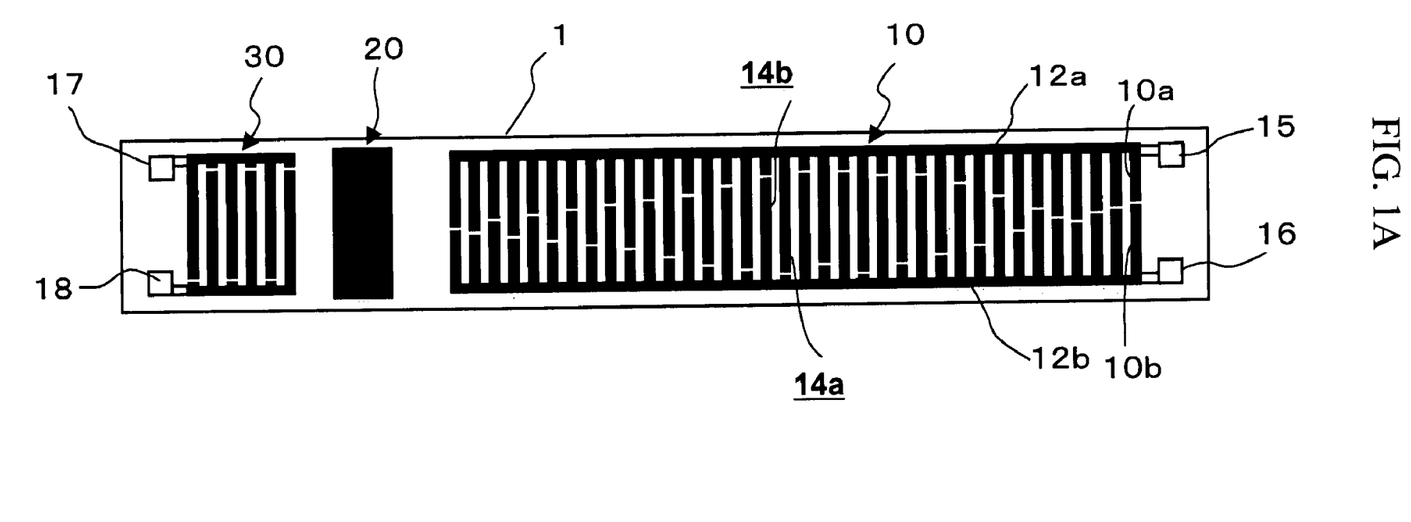
FIGS. 1A and 1B show a conventional SAW device.

FIG. 1 shows a filter with the SAW. Japanese Patent Application Publication No. 10-41778 (hereinafter referred to as Document 1) discloses this type of filter. Referring to FIG. 1, there are arranged a first IDT 10, a ground electrode 20, and a second IDT 30 on a piezoelectric substrate 1. The first IDT 10, the ground electrode 20, and the second IDT 30 are adjacently arranged in a direction of the SAW propagation. The ground electrode 20 is arranged between the first IDT 10 and the second IDT 30, serving as a shield electrode. The first IDT 10 serves as an input electrode (or output electrode) and the second IDT 30 serves as an output electrode (or input electrode). The ground electrode 20 prevents electromagnetic coupling of the IDT 10 and the IDT 30. Also, the ground electrode 20 is arranged on a tilt in order to prevent the SAW that travels from the IDT 10 (or the IDT 30) from being reflected by the ground electrode 20 and returning to the IDT 10 (or the IDT 30).

The IDT 10 includes a pair of comb-like electrode 10a and 10b. The comb-like electrode 10a includes a bus bar 12a and multiple electrode fingers 14a. The comb-like electrode 10b also includes a bus bar 12b and multiple electrode fingers 14b. The open edges of the electrode fingers 14a face those of the electrode fingers 14b, which are referred to as overlapping parts or crossing portions. The overlapping parts of the interleaved electrode fingers that face each other are involved in excitation of SAW. As shown in FIG. 1A, an electrode finger pattern is weighted. The electrode finger pattern is defined as a pattern formed by the electrode fingers. The electrode finger pattern may be weighted by, for example, apodization. By this apodization, lengths of the electrode fingers in the overlapping parts (hereinafter referred to as aperture length) vary in the propagation direction. The aperture lengths are relatively small in the vicinity of both sides of the IDT 10, which is defined as small overlapping parts. On the other hand, the aperture lengths are relatively large around the center of the IDT 10. The aperture length is proportional to excitation intensity.

Therefore, the strong SAWs are generated around the center of the IDT 10, and weak SAWs are generated in the vicinity of both ends of the IDT 10. The frequency characteristic may be altered by changing the weight by apodization.

Figure 1B:
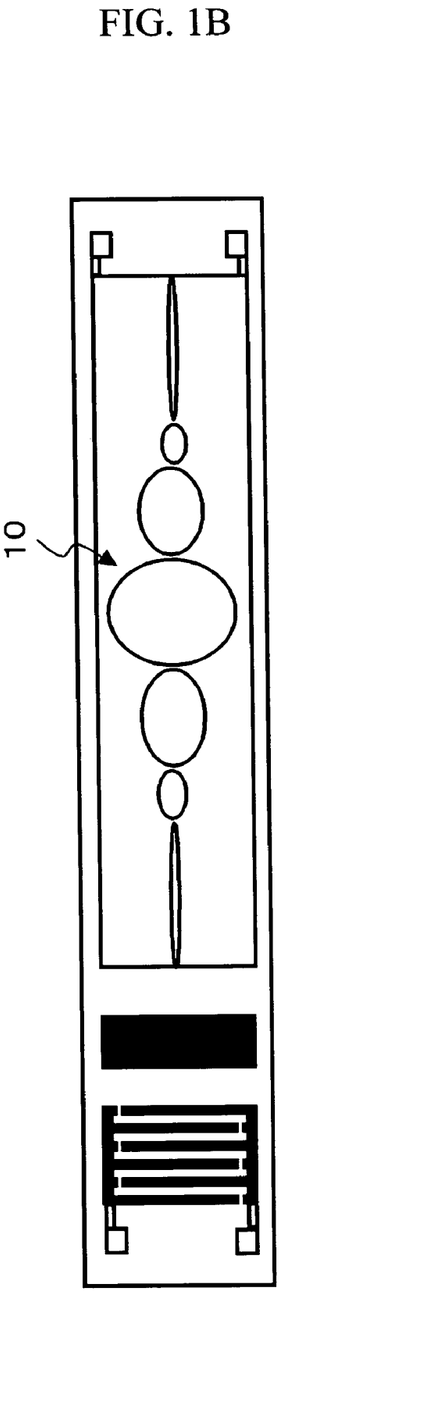
Figure 2:
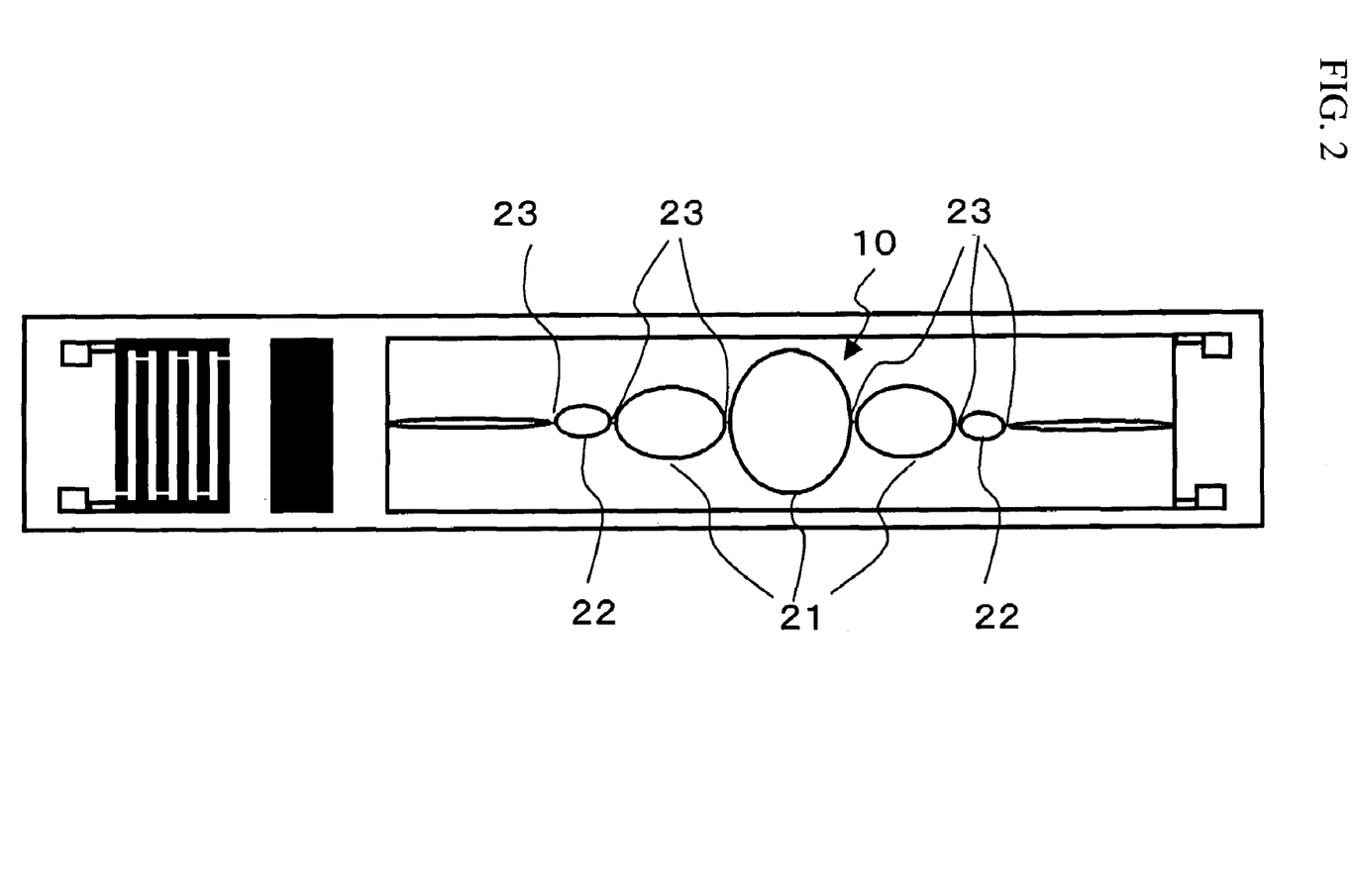
FIG. 2 is a view describing a main lobe, side lobes, and small electrode finger overlapping parts.

FIG. 1B shows an electrode finger pattern that is weighted by apodization. An apodized electrode or IDT denotes an electrode or IDT having an electrode finger pattern that is weighted by apodization. Referring to FIG. 1B, there is provided an electrode finger pattern having relatively long overlapping lengths (aperture lengths) of the electrode fingers around the center of the IDT 10 (which is referred to as main lobe). On both sides of the main lobe, there are provided multiple electrode finger patterns having the aperture lengths that are shorter than those of the main lobe (which is referred to as side lobe). The aperture lengths become shorter as the electrode fingers get closer to the ends of the IDT 10. Referring to FIG. 2, a main lobe 21 includes three lobes. Two second lobes 22 are provided on both sides of the main lobe 21. Small electrode finger overlapping parts 23 are provided between the three main lobes 21 and between the main lobe 21 and the second lobe 22. Generally, the small electrode finger overlapping parts 23 occupy 50 to 60 percent of the entire electrode finger pattern. It is general in design to have a sufficient impulse response time and a high-order side lobe in order to gain a favorable filter characteristic of the SAW device.

Referring back to FIG. 1A, the IDT 30 also includes a pair of comb-like electrodes. However, the IDT 30 is not weighted, which is different from the IDT 10. That is, all the electrode fingers have an identical overlapping length. This electrode pattern is referred to as a normalized electrode pattern, and the IDT having the aforementioned pattern is referred to as a normal IDT.

The bus bar 12a of the IDT 10 is connected to an electrode pad 15. The bus bar 12b is connected to an electrode pad 16. The bus bars of the IDT 30 are respectively connected to electrode pads 17 and 18.

A filter with the above-mentioned configuration serves as a bandpass filter.

However, there is the problem in that the above-mentioned conventional SAW device does not have a sufficiently large stopband attenuation.

SUMMARY OF THE INVENTION

The present invention has been made in view of the above circumstances and provides the SAW device having a high stopband attenuation.

According to an aspect of the present invention, there is provided a surface acoustic wave (SAW) device including a piezoelectric substrate, and a first interdigital transducer (IDT) and a second IDT provided on the piezoelectric substrate. The first IDT includes multiple tracks that have different frequency characteristics and are connected in parallel, and the second IDT has a normalized electrode pattern.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A description will now be given, with reference to the accompanying drawings, of embodiments of the present invention.

The inventors studied how the small electrode finger overlapping parts 23 of the IDT 10 affect the degree of attenuation in the stopband. The IDT 10 is weighted by apodization as shown in FIG. 2.

Figure 3:
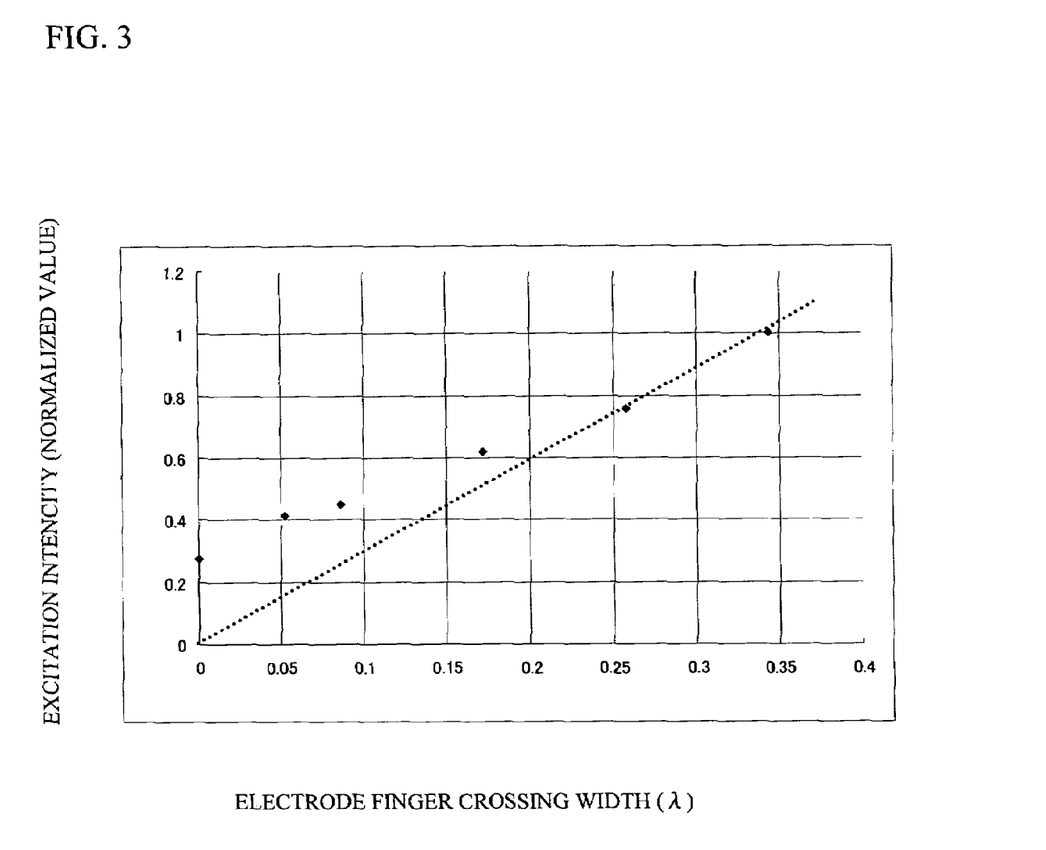
FIG. 3 is a graph describing a relationship between an aperture length and an excitation intensity.

FIG. 3 is a graph showing a measuring result of the relationship between the aperture length and an excitation intensity. The horizontal axis defines the aperture length. The vertical axis defines the normalized excitation intensity. The aperture length is shown by the wavelength of the SAW that corresponds to the central frequency of the SAW device. A dotted line shows theoretical values. As shown in FIG. 3, the inventors fount out that when the aperture length is $\lambda/4$ or less, the excitation intensity did not get smaller unlike the theoretical values, and bigger excitation intensities are obtained. In addition, the inventors found out that even when the aperture length is zero, the excitation intensity is not zero so that the SAW is generated. The inventors thought that this phenomenon may be caused by the leaked electric field generated by the small electrode finger overlapping parts.

Then, the inventors divided the electrodes of the IDT into tracks. Each track included a small number of the small electrode finger overlapping parts as compared to the conventional technique so as to decrease the leaked electric field.

First Embodiment

Figure 4:
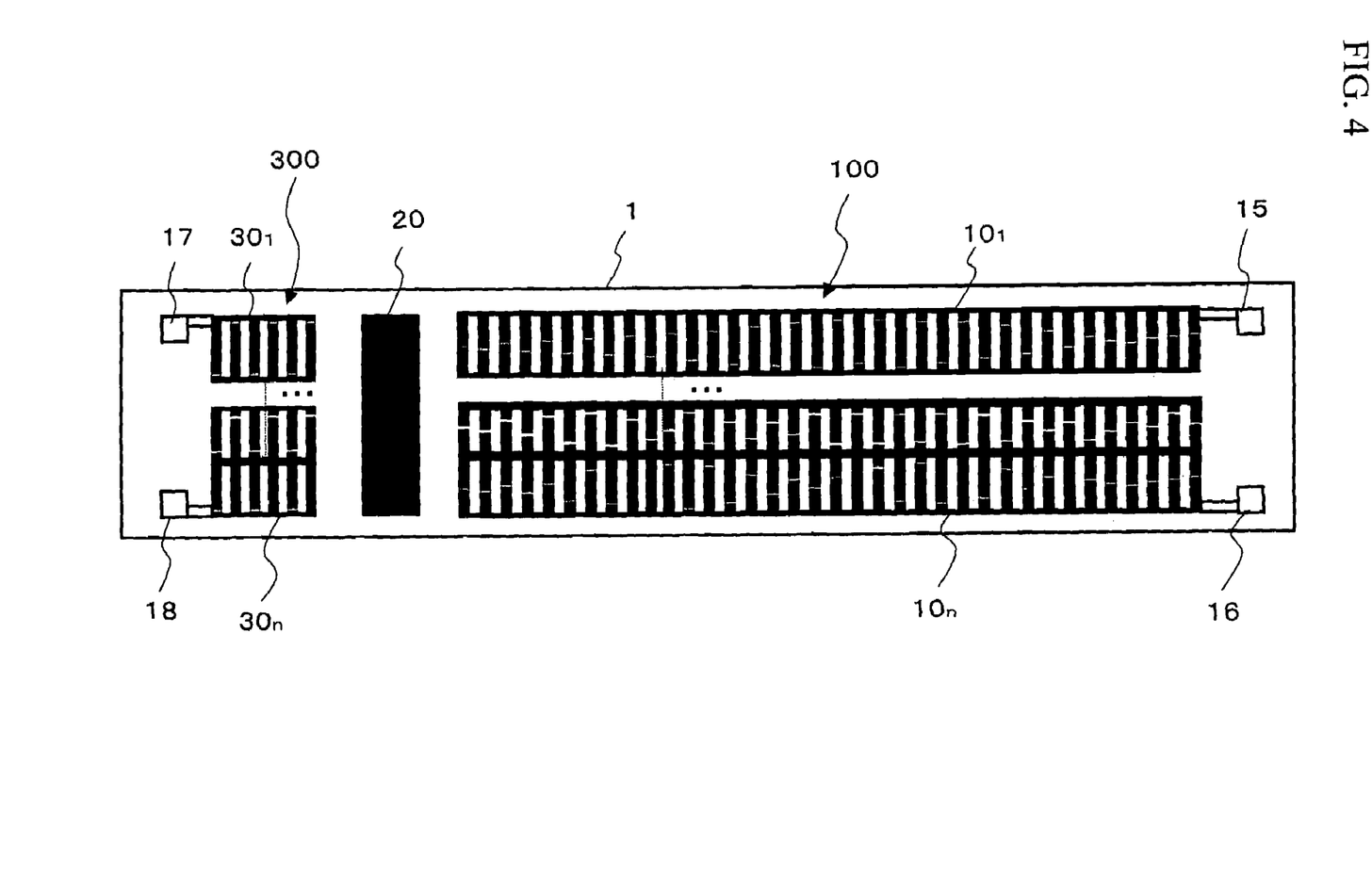
FIG. 4 is a top view of a SAW device in accordance with a first embodiment of the present invention.

A description will now be given of a first embodiment of the present invention. FIG. 4 is a top view of a SAW device in accordance with a first embodiment of the present invention. The SAW device includes a piezoelectric substrate 1, a first IDT 100 and a second IDT 300, which IDTs are arranged thereon. A ground electrode 20 is arranged between the IDT 100 and the IDT 300. The IDT 100 includes multiple tracks $10_1$ to $10_n$ having different frequency characteristics, which are connected in parallel where n denotes a natural number equal to or greater than two. Each of the tracks $10_1$ to $10_n$ includes a pair of comb-like electrodes. Adjacent tracks share a single bus bar. One of the bus bars connected by the track $10_n$ is connected to an electrode pad 15, and the other bus bar connected by the track $10_n$ is connected to an electrode pad 16. An alternating voltage is applied to one of the electrode pads 15 and 16. A reference potential, for example, the ground potential is applied to the other electrode pad. One comb-like electrode in each of the tracks $10_2$ to $10_{n-1}$ is connected to the electrode pad 15 and the other comb-like electrode is connected to the electrode pad 16 through interconnection patterns, which are not shown. The tracks $10_1$ to $10_n$ include different electrode finger patterns that are weighted by different apodizations.

Figure 5:
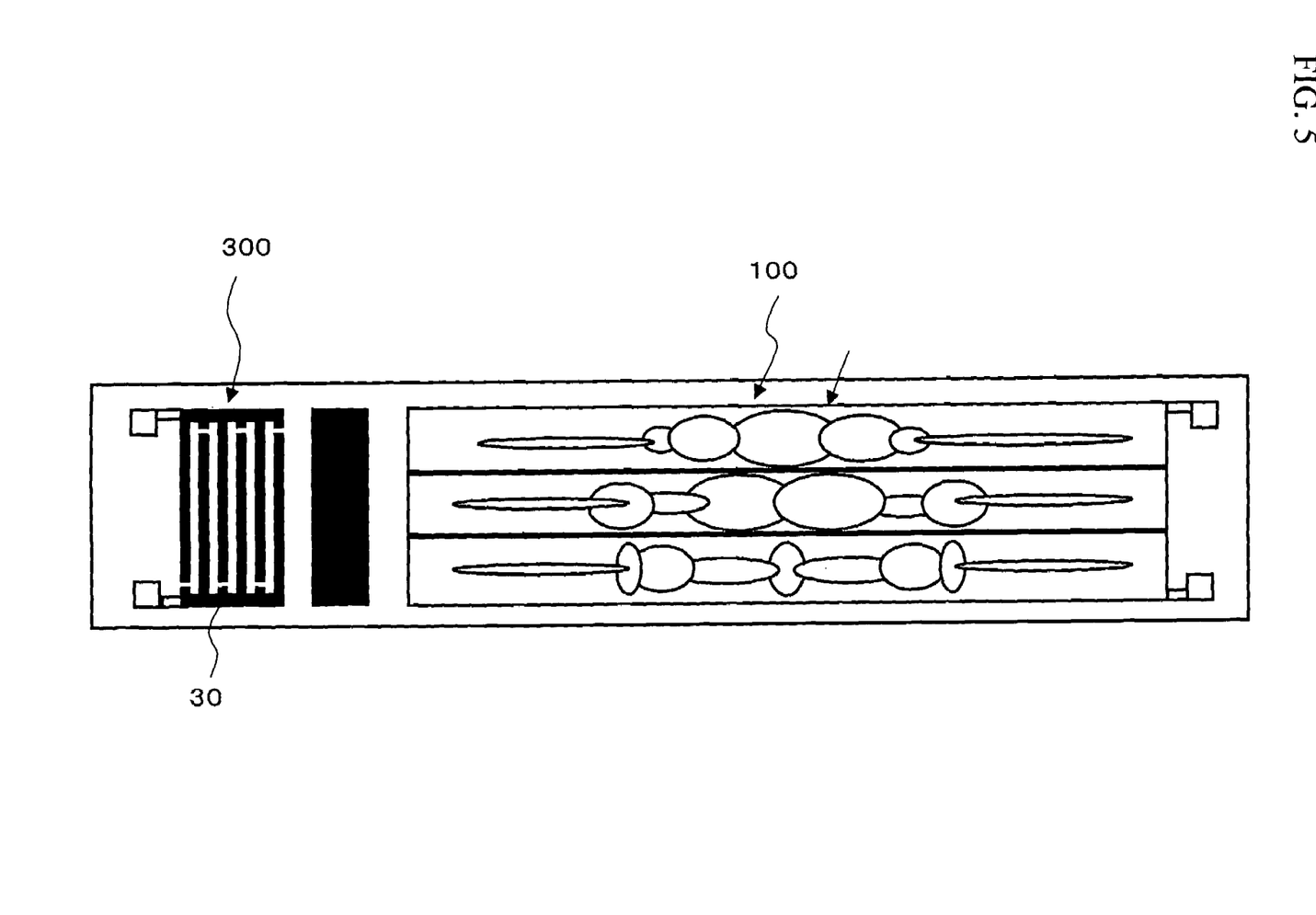
FIG. 5 shows tracks weighted by apodization of the SAW device in accordance with the first embodiment of the present invention.

FIG. 5 schematically shows the electrode finger patterns that are weighted by different apodizations. Only three tracks weighted by different apodizations are shown to simplify the view. Referring to FIG. 5, each track is weighted by a different apodization to decrease the small electrode finger overlapping parts (or the crossing part of the interleaved electrode fingers) as compared to the conventional technique. As an example, preferably, the electrode finger pattern is weighted by apodization so that the 10 percent or less of the total in each track is occupied by the electrode finger overlapping parts having the width of $\lambda/4$ or less. Conventionally, as a result of an optimal design as described, 50 to 60 percent of the total was designed to be the electrode finger overlapping parts having the width of $\lambda/4$ or less. Therefore, the present invention makes it possible to obtain a great stopband attenuation as compared to the conventional technique, even if the electrode finger overlapping parts is less than 10 percent of the total. When the frequency characteristics of the tracks $10_1$ to $10_n$ overlap, it is designed to form a substantially flat passband. As an example, the frequency characteristics of the tracks $10_1$ to $10_n$ are asymmetric to the center frequency of the filter, which is the center frequency of the passband.

Referring back to FIG. 4, the IDT 300 includes multiple tracks $30_1$ to $30_n$, which correspond to the multiple tracks $10_1$ to $10_n$ of the IDT 100. Each of the tracks $30_1$ to $30_n$ has a normalized electrode. One bus bar of the track $30_1$ is connected to an electrode pad 17, and the other bus bar is connected to an electrode pad 18. An alternating voltage is applied to one of the electrode pads 17 and 18, and a reference potential, for example, the ground potential, is applied to the other of the electrode pads 17 and 18. One comb-like electrode in each of the tracks $30_2$ to $30_{n-1}$ is connected to the electrode pad 17 and the other comb-like electrode is connected to the electrode pad 18 through the interconnection patterns, which are not shown. As shown in FIG. 5, the IDT 300 may be composed of a pair of comb-like electrodes 30, which is different from the multiple tracks $10_1$ to $10_n$ in the IDT 100.

In accordance with the first embodiment, the IDT 100 is composed of the multiple tracks $10_1$ to $10_n$, each of which includes small electrode finger overlapping parts as compared to those of the conventional technique. Thus, it is possible to decrease the leaked electric field generated by the IDT 100, and thereby to improve the stopband attenuation.

Second Embodiment

Figure 6:
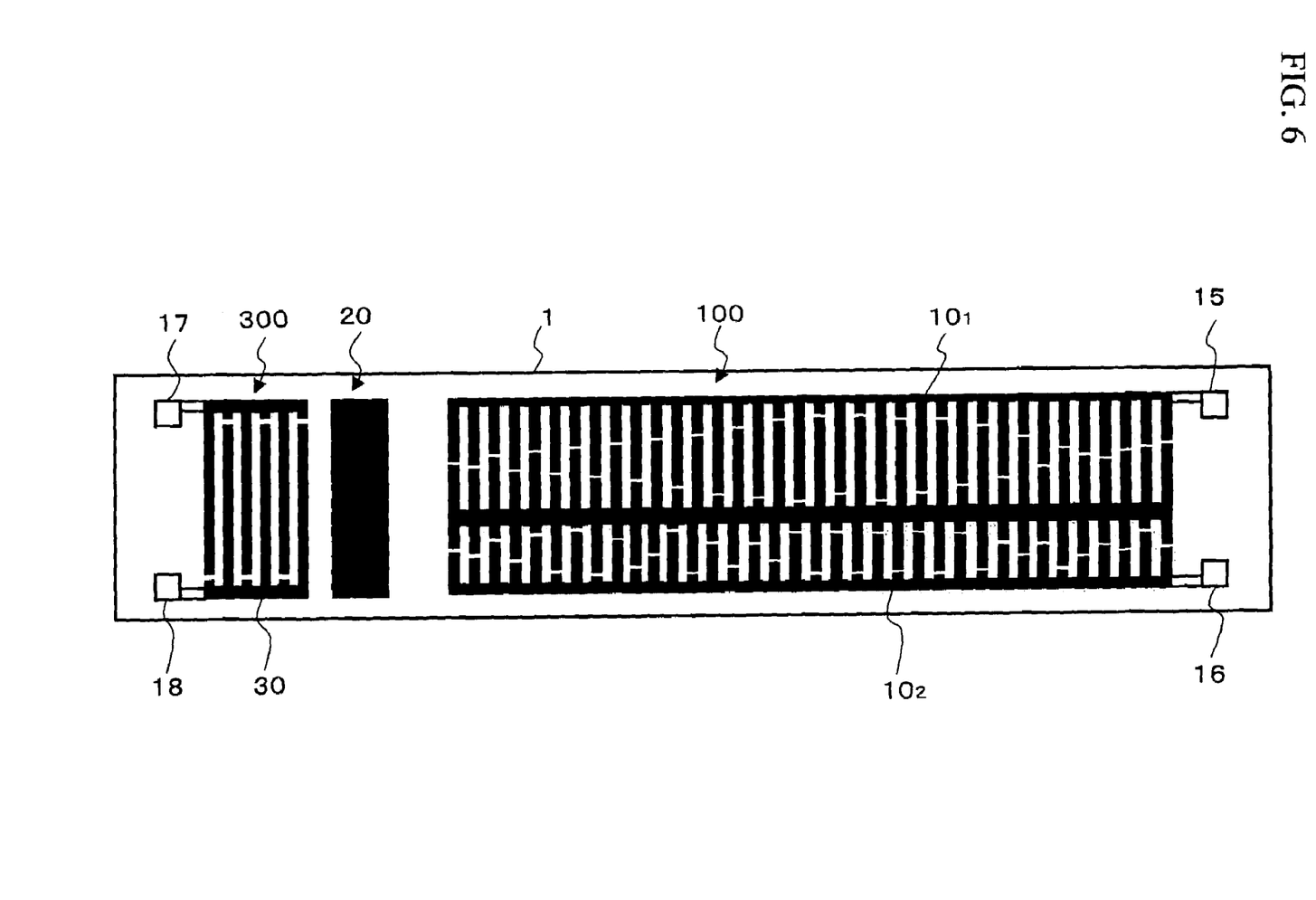
FIG. 6 is a top view of a SAW device in accordance with a second embodiment of the present invention.

FIG. 6 is a top view of a SAW device in accordance with a second embodiment of the present invention. The IDT 100 of this embodiment includes two tracks $10_1$ and $10_2$, and the IDT 300 includes one track. The same alternating voltage is applied to both electrode pads 15 and 16. A shared bus bar is set at the ground potential. The largest aperture length (electrode finger overlapping length) of the track $10_1$ is larger than that of the track $10_2$.

Figure 7:
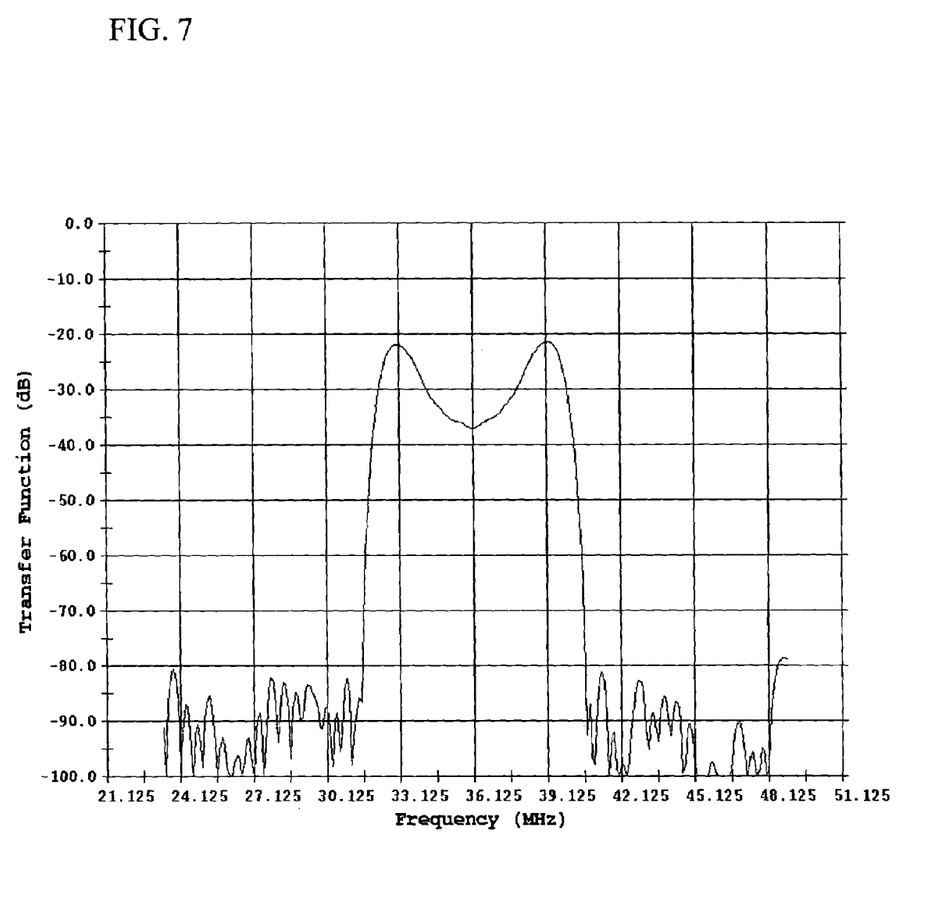
FIG. 7 shows a simulation result of a frequency characteristic of a track $10_1$ as shown in FIG. 6.
Figure 8:
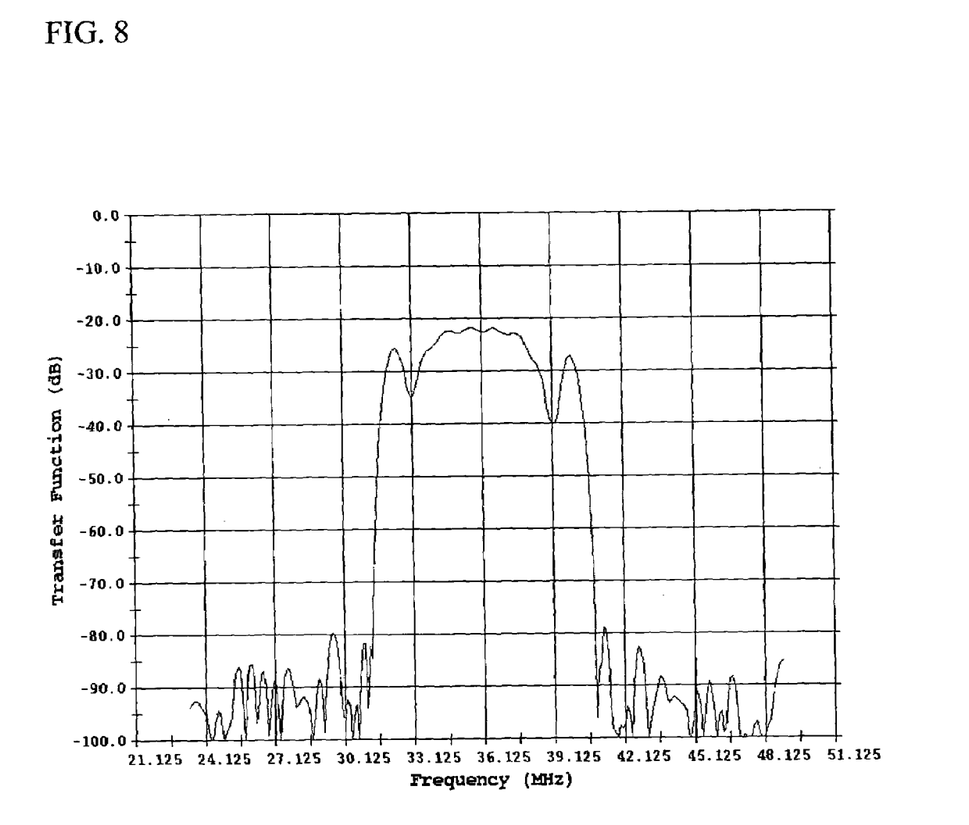
FIG. 8 shows a simulation result of the frequency characteristic of a track $10_2$ as shown in FIG. 6.
Figure 9:
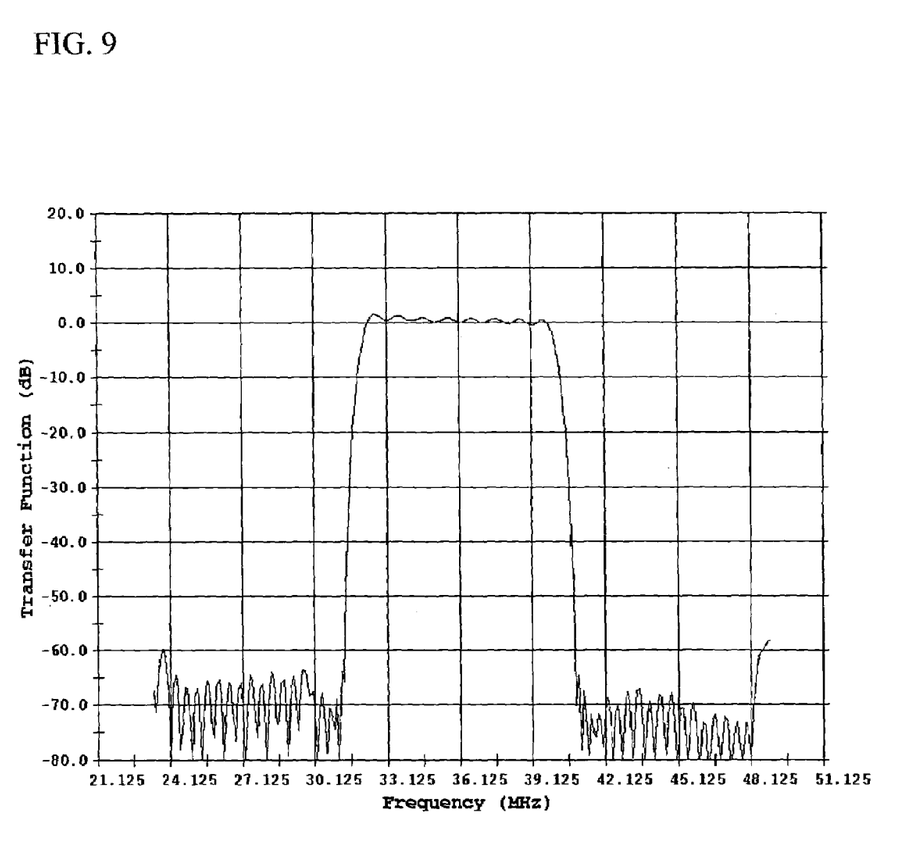
FIG. 9 shows a simulation result of the frequency characteristic of the SAW device as shown in FIG. 6.

FIG. 7 shows a frequency characteristic of the track $10_1$. FIG. 8 shows the frequency characteristic of the track $10_2$. The above-mentioned frequency characteristics are obtained from simulation. In FIGS. 7 and 8, the horizontal axis defines frequency (MHz), and the vertical axis defines attenuation (dB). Both tracks $10_1$ and $10_2$ have relatively small ratios of the electrode finger overlapping parts, which is approximately 10 percent, and the frequency characteristic in the passband is not flat. The frequency characteristic of the track $10_1$ and that of the track $10_2$ are complementary. The frequency characteristic in FIG. 7 has peaks on both sides of the passband, which are ripples. On the contrary, the frequency characteristic in FIG. 8 has bottoms on both sides of the passband, which are also ripples. FIG. 9 is a simulation result of overlapping the frequency characteristics of FIGS. 7 and 8. The SAW device has a substantially flat passband and a large frequency characteristic in the stopband attenuation.

Figure 10A:
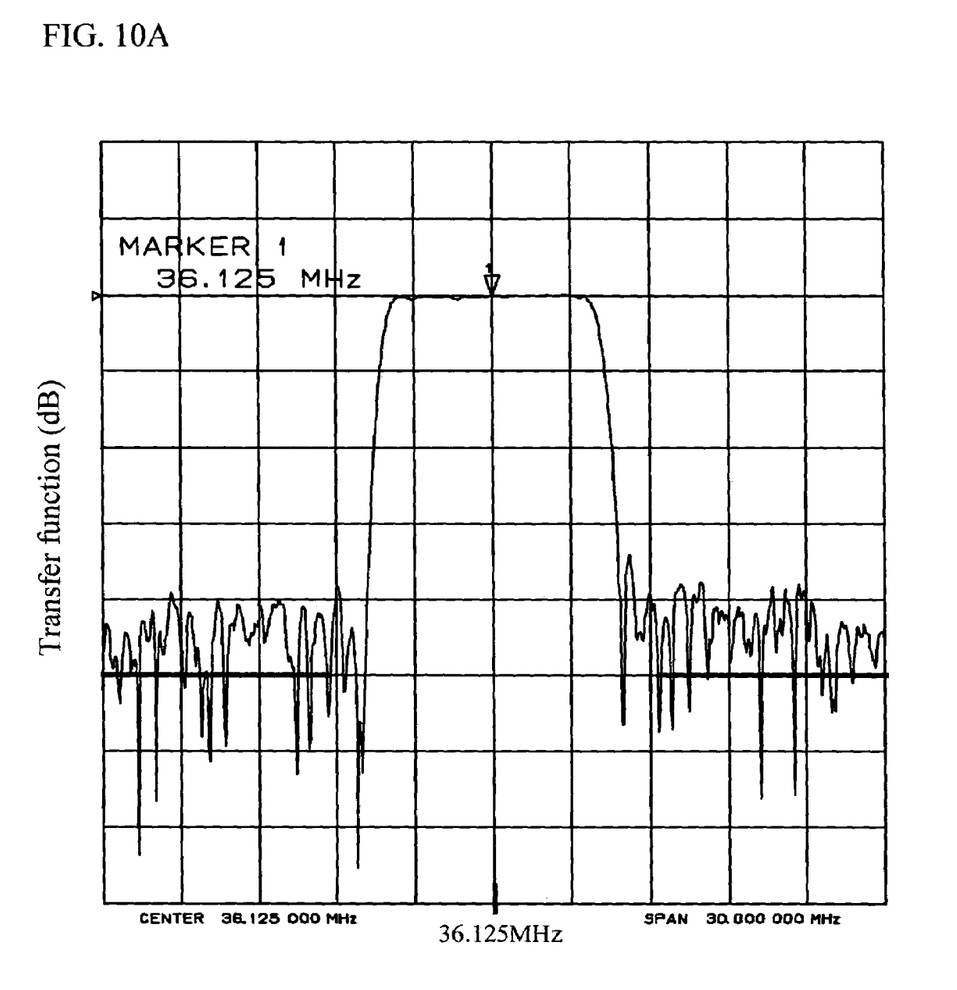
FIG. 10A is a graph showing a measurement result of the frequency characteristic of the conventional SAW device shown in FIG. 1.
Figure 10B:
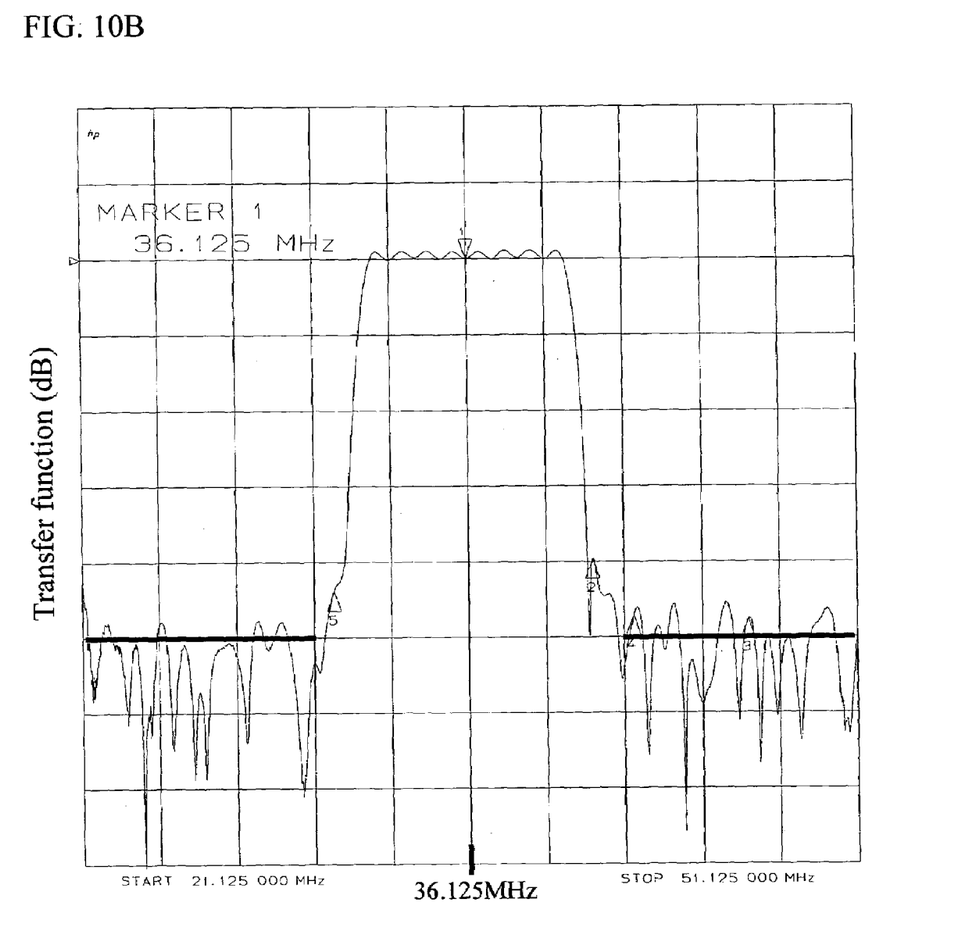
FIG. 10B is a graph showing a measurement result of the frequency characteristic of the second embodiment of the present invention in FIG. 6.

FIG. 10A is a graph showing a measurement result of the frequency characteristic of the SAW device as shown in FIG. 1A. FIG. 10B is a graph showing a measurement result of the frequency characteristic of the SAW device as shown FIG. 6, in accordance with the second embodiment of the present invention. The center frequency in the passband of each SAW device is 36.125 MHz. In the second embodiment of the present invention, an optimal design of the tracks $10_1$ and $10_2$ that were weighted by apodization has been done, under the condition that the aperture lengths in the left and right second side lobes are equal to or greater than 40 percent of the largest aperture length of the main lobe. In contrast, the SAW device shown in FIG. 1A is weighted by apodization under the condition that the aperture lengths in the left and right second side lobes are equal to or greater than 10 percent of the largest aperture length of the main lobe. As compared to the conventional frequency characteristics, although the frequency characteristic has variations to some extent (approximately 0.3 dB) in the passband in accordance with the second embodiment of the present invention, it has been found that the stopband attenuation has been improved on the low and high frequency sides in the passband. Generally, frequency variations of about 1.0 dB are allowable. Therefore, 0.3 dB of the frequency characteristic does not practically pose a problem.

Figure 11:
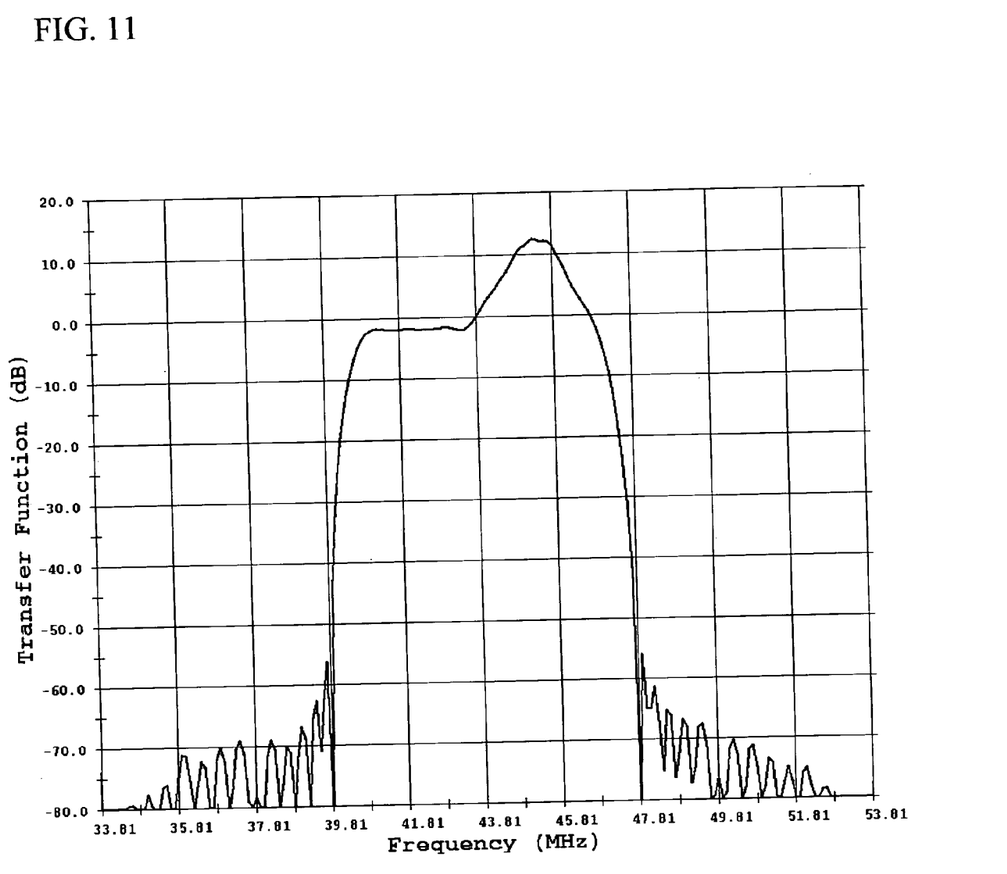
FIG. 11 shows another simulation result of the frequency characteristic of a track $10_1$ as shown in FIG. 6.
Figure 12:
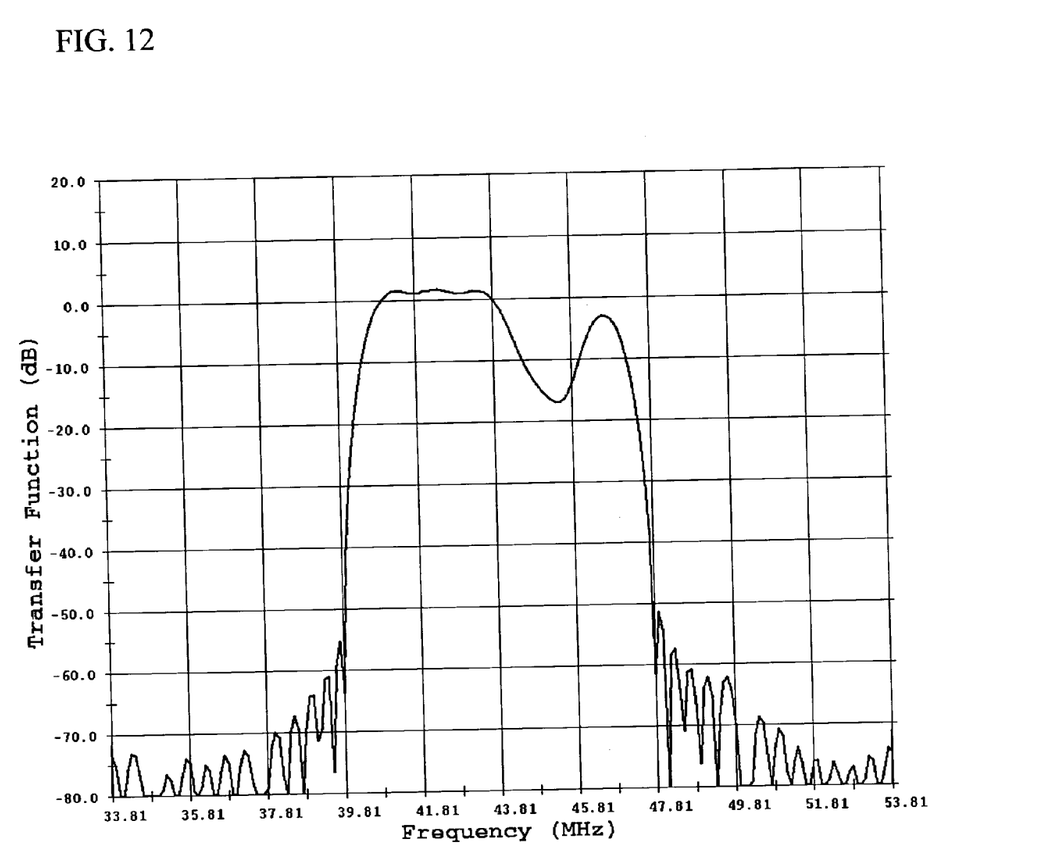
FIG. 12 shows another simulation result of the frequency characteristic of a track $10_2$ as shown in FIG. 6.
Figure 13:
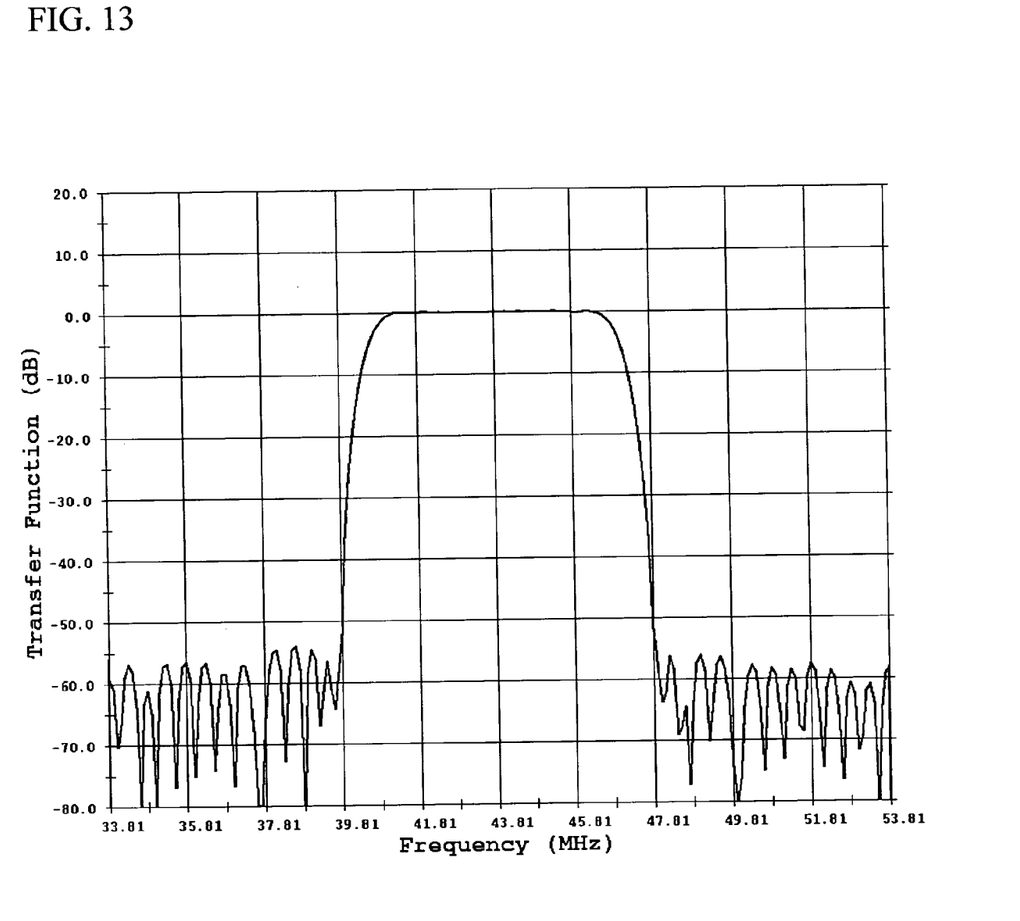
FIG. 13 shows another simulation result of the frequency characteristic of the SAW device as shown in FIG. 6.

The complementary frequency characteristics of the tracks $10_1$ and $10_2$ shown in FIG. 6 are not limited to FIGS. 7 and 8. The frequency characteristics of FIGS. 7 and 8 are almost symmetric to the center frequency. However, they are allowed to be asymmetric. An example is shown in FIGS. 11 and 12. FIG. 11 is a simulation result of the frequency characteristic of the track $10_1$. FIG. 12 is a simulation result of the frequency characteristic of the track $10_2$. The frequency characteristic in FIG. 11 has peaks on both sides of the passband, which are ripples. On the contrary, the frequency characteristic in FIG. 12 has bottoms on both sides of the passband. The frequency characteristics of FIG. 11 and that of FIG. 12 are complementary. By overlapping the above-mentioned frequency characteristics, the flat passband characteristic is obtainable as shown in FIG. 13.

As described, in accordance with the second embodiment of the present invention, the IDT 100 includes two tracks $10_1$ and $10_2$, each of which includes the electrode finger overlapping parts smaller than the conventional technique. This makes it possible to decrease the leaked electric field generated on IDT 100, and thereby to make the stopband attenuation larger.

The present invention is not limited to the above-mentioned first embodiment, and other embodiments, variations and modifications may be made without departing from the scope of the present invention.

The present invention is based on Japanese Patent Application No. 2003-388576 filed on Nov. 18, 2003, the entire disclosure of which is hereby incorporated by reference.

What is claimed is:

1. A surface acoustic wave (SAW) device comprising:
a piezoelectric substrate; and
a first interdigital transducer (IDT) and a second IDT provided on the piezoelectric substrate,
wherein:
the first IDT includes multiple tracks that have different frequency characteristics and are connected in parallel; and
the second IDT has a normalized electrode pattern.

2. The SAW device as claimed in claim 1, wherein the first IDT has two tracks.

3. The SAW device as claimed in claim 1, wherein the frequency characteristics of the multiple tracks are asymmetric to a center frequency of a frequency characteristic of the SAW device.

4. The SAW device as claimed in claim 1, wherein the frequency characteristics of the multiple tracks form a substantially flat passband, when the frequency characteristics are overlapped.

5. The SAW device as claimed in claim 1, wherein the first IDT has two tracks, and the two tracks are supplementary in a passband of the SAW device.

6. The SAW device as claimed in claim 1, wherein:
the first IDT has two tracks having electrode finger patterns that are weighted by apodization; and
at least one of the two tracks is weighted by apodization so that left and right second side lobes have aperture lengths equal to or greater than 40 percent of a largest aperture length in a main lobe.

7. The SAW device as claimed in claim 1, wherein the first IDT has electrode finger patterns that are weighted by different apodizations.

8. The SAW device as claimed in claim 1, wherein the second IDT has at least one track.

* * * * *